(12) United States Patent
Radosavljevic et al.

(10) Patent No.: US 10,535,777 B2
(45) Date of Patent: Jan. 14, 2020

(54) NANORIBBON STRUCTURES WITH RECESSED SOURCE-DRAIN EPITAXY

(71) Applicant: Intel Corporation, Santa Clara, CA (US)

(72) Inventors: Marko Radosavljevic, Portland, OR (US); Han Wui Then, Portland, OR (US); Sansaptak Dasgupta, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 1 day.

(21) Appl. No.: 15/940,424

(22) Filed: Mar. 29, 2018

(65) Prior Publication Data
US 2019/0305135 A1    Oct. 3, 2019

(51) Int. Cl.
| | |
|---|---|
| *H01L 29/66* | (2006.01) |
| *H01L 29/786* | (2006.01) |
| *H01L 29/06* | (2006.01) |
| *H01L 29/20* | (2006.01) |
| *H01L 29/04* | (2006.01) |
| *H01L 29/423* | (2006.01) |
| *H01L 21/306* | (2006.01) |
| *H01L 21/02* | (2006.01) |

(52) U.S. Cl.
CPC .... *H01L 29/78618* (2013.01); *H01L 21/0254* (2013.01); *H01L 21/02603* (2013.01); *H01L 21/02609* (2013.01); *H01L 21/30612* (2013.01); *H01L 29/045* (2013.01); *H01L 29/0673* (2013.01); *H01L 29/2003* (2013.01); *H01L 29/42392* (2013.01); *H01L 29/66522* (2013.01); *H01L 29/66545* (2013.01); *H01L 29/66742* (2013.01); *H01L 29/78681* (2013.01); *H01L 29/78696* (2013.01)

(58) Field of Classification Search
None
See application file for complete search history.

(56) References Cited

U.S. PATENT DOCUMENTS

2017/0092747 A1\* 3/2017 Nakata ............. H01L 29/66462
2017/0365700 A1\* 12/2017 Beam, III ............... H01L 29/36

\* cited by examiner

*Primary Examiner* — Minh Loan Tran
(74) *Attorney, Agent, or Firm* — Green, Howard & Mughal LLP

(57) ABSTRACT

Nanoribbon Field Effect Transistors (FETs) offer significant performance increases and energy consumption decreases relative to traditional metal oxide semiconductor (MOS) transistors. Various embodiments are directed to nanoribbon FETs having III-N channel materials and methods of forming the same. An integrated circuit (IC) structure can include a first layer on a substrate. The first layer can include a group III semiconductor material and nitrogen. The IC structure can include recessed source and drain regions formed on the first layer using planar epitaxy. The IC structure can include a second layer between the recessed source and drain. A gate wraps around at least part of the second layer.

20 Claims, 8 Drawing Sheets

NANORIBBON STRUCTURES WITH RECESSED SOURCE-DRAIN EPITAXY

TECHNICAL FIELD

The present disclosure generally relates to semiconductor devices. More specifically, the present disclosure relates to nanoribbon transistors.

BACKGROUND

Traditional metal oxide semiconductor field effect transistor (MOSFET) fabrication techniques include process flows for constructing planar transistors. With planar transistors, transistor density can be increased by decreasing the pitch between transistor gate elements. With planar transistors, however, the ability to decrease gate pitch is fundamentally limited by the required gate length and spacer thickness. Moreover, as transistor size requirements in integrated circuits (ICs) continue to decrease, power supply voltages and threshold voltages are also decreasing. Lower threshold voltages can be difficult to obtain in conventional MOSFETs because, as the threshold voltage is reduced, the ratio of ON-current to OFF-current may also decrease. ON-current refers to the current through a MOSFET when a gate voltage is above the threshold voltage and can be as high as the supply voltage, while OFF-current refers to current through a MOSFET when the gate voltage is below the threshold voltage and can approach or equal zero volts.

Considerable research has been devoted to the development of nonplanar transistor architectures. Some non-planar transistor architectures, such as nanoribbon transistors, nanosheet transistors, and nanowire transistors, employ semiconductor channels with gate-all-around (GAA) technologies to achieve increased device density, greater power efficiency, and some increased performance over lateral devices. In a nanoribbon transistor, the gate stack wraps around the full perimeter of each nanoribbon, enabling fuller depletion in the channel region, and reducing short-channel effects due to a steeper subthreshold swing (SS) and a smaller drain induced barrier lowering (DIBL).

BRIEF DESCRIPTION OF THE FIGURES

Reference will now be made to the accompanying drawings, which are not necessarily drawn to scale, and wherein.

DETAILED DESCRIPTION

Figure 1:
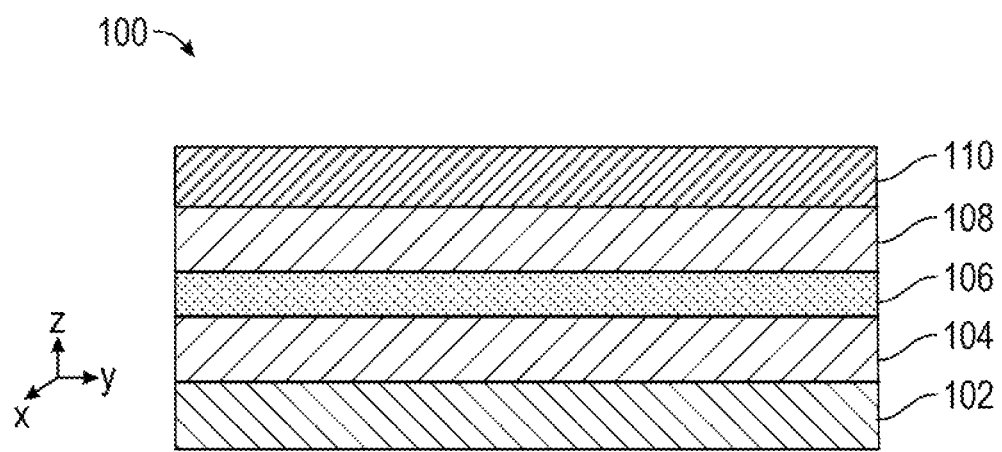
FIG. 1 shows a partial structure of a semiconductor device during the fabrication of a nanoribbon transistor, in accordance with one or more example embodiments of the disclosure.

Embodiments of the disclosure are described more fully hereinafter with reference to the accompanying drawings, in which example embodiments of the disclosure are shown. This disclosure may, however, be embodied in many different forms and should not be construed as limited to the example embodiments set forth herein; rather, these embodiments are provided so that this disclosure will be thorough and complete, and will fully convey the scope of the disclosure to those skilled in the art. Like numbers refer to like, but not necessarily the same or identical, elements throughout.

The following embodiments are described in sufficient detail to enable at least those skilled in the art to understand and use the disclosure. It is to be understood that other embodiments would be evident based on the present disclosure and that process, mechanical, material, dimensional, process equipment, and parametric changes may be made without departing from the scope of the present disclosure.

In the following description, numerous specific details are given to provide a thorough understanding of various embodiments of the disclosure. However, it will be apparent that the disclosure may be practiced without these specific details. In order to avoid obscuring the present disclosure, some well-known system configurations and process steps may not be disclosed in full detail. Likewise, the drawings showing embodiments of the disclosure are semi-diagrammatic and not to scale and, particularly, some of the dimensions may be exaggerated in the drawings for the clarity of presentation. In addition, where multiple embodiments are disclosed and described as having some features in common, for clarity and ease of illustration, description, and comprehension thereof, similar and like features will ordinarily be described with like reference numerals even if the features are not identical.

The term "horizontal" as used herein may be defined as a direction parallel to a plane or surface (for example, surface of a substrate), regardless of its orientation. The term "vertical," as used herein, may refer to a direction orthogonal to the horizontal direction as just described. Terms, such as "on," "above," "below," "bottom," "top," "side" (as in "sidewall"), "higher," "lower," "upper," "over," and "under," may be referenced with respect to a horizontal plane, where the horizontal plane can include an x-y plane, a x-z plane, or a y-z plane, as the case may be. The terms "on," "over," "above," "higher," "positioned on," or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary elements at the interface between the two elements. The term "processing" as used herein includes deposition of material or photoresist, patterning, exposure, development, etching, cleaning, ablating, polishing, and/or removal of the material or photoresist as required in formation of a described structure.

"An embodiment," "various embodiments," and the like indicate embodiment(s) so described may include particular features, structures, or characteristics, but not every embodiment necessarily includes the particular features, structures, or characteristics. Some embodiments may have some, all, or none of the features described for other embodiments. "First," "second," "third," and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact. Also, while similar or same numbers may be used to designate same or similar parts in different figures, doing so does not mean all figures including similar or same numbers constitute a single or same embodiment.

The terms "perpendicular," "orthogonal," "coplanar," and/or "parallel" may mean substantially perpendicular, orthogonal, coplanar, or parallel, respectively. For example, "perpendicular" can mean perpendicular within ±20, 15, 10, or 5 degrees. Further, the figures shown herein may not have precisely vertical or horizontal edges, but rather may have some finite slope and have surface roughness, as is to be expected for fabricated devices. The terms "about," "substantially," "approximately," and variations thereof, are intended to include a degree of error associated with a measurement of the particular quantity using equipment available at the time of filing the application. For example, "about" can include a range of +7% or 5%, or 2% of a given value.

The phrase "selective to," such as, for example, "etching a first element selective to a second element," means that the first element is etched while the second element serves as an etch stop. The term "conformal," such as, for example, "forming a conformal layer," means that the deposited or otherwise formed thickness of the layer is substantially the same on all surfaces, or that the thickness variation is less than 15% of the nominal thickness of the layer.

The terms "epitaxy" and "epitaxial growth" refer to the growth of a crystalline semiconductor material on a surface of another crystalline semiconductor material. During an epitaxial growth, a crystalline overlayer (the semiconductor material being grown) forms on the surface of a seed material (known as the deposition surface). In an epitaxial deposition process, the overlayer can have substantially the same crystalline characteristics as the seed material. For example, an epitaxially grown semiconductor material deposited on a crystalline surface having a Miller indices of {111} can take on a {111} orientation. Epitaxial growth can be selective to forming on a semiconductor surface, and may or may not deposit material on other exposed surfaces, such as a silicon dioxide or silicon nitride surface.

As discussed previously herein, nanoribbon transistors represent a class of transistors that can feature performance increases and energy consumption decreases over conventional, planar MOSFETs. There are challenges, however, in fabricating some nanoribbon transistor architectures. One such challenge is the difficulty in fabricating nanoribbon transistors using III-N semiconductor materials. III-N semiconductor materials include those materials that are formed by combining group III elements (for example, Al, Ga, In) with nitrogen. For example, some III-N semiconductor materials can include, but are not limited to, GaN, InN, and their alloys (for example, AlGaN, InGaN, InAlGaN).

Transistors based on III-N semiconductor materials have been studied in high-frequency, high-power applications, and offer a substantial opportunity to enhance the performance of electronic devices such as high electron mobility transistors (HEMTs). In general, III-N semiconductor material based transistors provide a high breakdown voltage ($V_{BD}$) and low on-resistance ($R_{ON}$) that is beyond the material limits of conventional silicon (Si), silicon germanium (SiGe), III-V compound semiconductor (for example, indium arsenide), and silicon carbide (SiC) based devices.

Due to process design and fabrication difficulties, many III-N devices are typically planar in nature. As previously discussed herein, planar architectures suffer from fundamental scaling limits. Consequently, significant effort has been expended to develop nonplanar III-N device architectures. The resulting approaches to non-planar III-N devices, however, are somewhat limited. For example, conventional GaN-based nanoribbon transistors may rely on complex epitaxy integration schemes, such as lateral epitaxial overgrowth, to create the necessary nanoscale structures. Accordingly, these conventional techniques are impractical, expensive, or both.

Turning now to aspects of the present disclosure, various embodiments described herein provide novel designs and fabrication methods for providing III-N nanoribbon transistors having recessed source and drain epitaxies. Advantageously, the III-N nanoribbon transistor architecture described herein may require only a planar source-drain epitaxy. Rather than requiring a complex integration scheme to form the III-N nanoribbons, certain embodiments herein may leverage the etch selectivity of various materials with respect to a same wet etch solution to enable an undercut etch process to release the nanoribbons. The undercut etch can occur, for example, during a replacement metal gate (RMG) portion of a workflow in a gate-last process scheme.

FIG. 1 depicts a cross-sectional view of a semiconductor structure 100 during the fabrication of a III-N nanoribbon transistor in accordance with one or more example embodiments of the disclosure. In one embodiment, the semiconductor structure 100 can include a substrate 102. In one embodiment, the substrate 102 can refer to a solid, substantially planar substance onto which a layer of another substance is applied, and to which that second substance adheres. The substrate 102 can be made of any suitable substrate material, such as, for example, monocrystalline Si, SiGe, SiC, III-V compound semiconductor, II-VI compound semiconductor, or semiconductor-on-insulator (SOI). In one embodiment, the substrate 102 may be a planar epitaxy silicon substrate. In one embodiment, the substrate 102 includes a {111} orientated crystalline structure. A {111} orientated crystalline structure advantageously provides a hexagonal lattice, which is closely compatible to the lattice structure of some III-N materials, such as, for example, GaN. In this manner lattice mismatch (the spacing between atoms), and consequently, defects, can be reduced. The substrate 102 can include other crystalline orientations, for example, a {100} orientated crystalline surface, and these other orientations are within the contemplated scope of the disclosure. In one embodiment, the substrate 102 includes a buried oxide layer (not depicted). The buried oxide layer can be made of any suitable dielectric material, such as, for example, a silicon oxide.

The semiconductor structure 100 can be electrically isolated from other regions of the substrate 102 by an isolation structure (not depicted). The isolation structure (which can include a shallow trench isolation region) can be made of any material suitable to insulate adjacent devices and prevent current leakage. The isolation structure can provide one or more field isolation regions that isolate one channel (nanoribbon) from other channels, for example, other channels on adjacent devices. In one embodiment, the isolation structure can include an oxide layer (for example, silicon dioxide), or any other electrically insulating layer. In one embodiment, the isolation structure can include an interlayer dielectric (ILD), such as silicon dioxide. In one embodiment, the isolation structure may include polyimide, epoxy, photodefinable materials (for example, benzocyclobutene), WPR-series materials, and/or spin-on-glass. In one embodiment, the isolation structure can include a low permittivity (low-k) ILD layer. In one embodiment, low-k can refer to dielectrics having a dielectric constant (permittivity k) lower than the permittivity of silicon dioxide. In one embodiment, a thickness of the isolation structure can be approximately 10 nm to approximately 300 nm, with an example thickness of approximately 30 nm to approximately 50 nm. In one embodiment, the isolation structure can be deposited using physical vapor deposition (PVD), chemical vapor deposition (CVD), metal organic chemical vapor deposition (MOCVD), molecular beam epitaxy (MBE), and/or atomic layer deposition (ALD), and the like.

In one embodiment, a semiconductor layer 104 may be formed on the substrate 102. The semiconductor layer 104 can be made of any suitable III-N material, so long as the III-N material can serve as an etch stop during a subsequent undercut etch process, described in further detail herein. In one embodiment the semiconductor layer 104 includes gallium nitride (GaN). In one embodiment, the semiconductor layer 104 may be epitaxially grown on the substrate 102 using a planar epitaxy process. As discussed previously herein, the substrate 102 can include a {111} hexagonal lattice. Accordingly, in one embodiment, planar epitaxy results in a semiconductor layer 104 having a {111} orientated crystalline structure. The semiconductor layer 104 can be epitaxially grown to a height ranging from 5 nm to 50 nm or more, for example, 10 nm, although other heights are within the contemplated scope of the disclosure.

In one embodiment, a sacrificial layer 106 may be formed on the semiconductor layer 104. The sacrificial layer 106 may include sacrificial material selected such that the sacrificial layer 106 can be etched selective to the semiconductor layer 104 during a subsequent undercut etch process, described in further detail herein. In one embodiment, the sacrificial layer 106 includes a metal-rich nitride. For example, in one embodiment the semiconductor layer 104 may be a GaN layer and the sacrificial layer 106 may be an aluminum rich layer, such as, for example, aluminum nitride (AlN). As used herein, an aluminum "rich" layer refers to a layer having an aluminum atomic concentration of at least 10%, for example, 10, 15, 20, 25, 40, 60, 70, or 95% aluminum by atomic concentration. In one embodiment, the sacrificial layer 106 may be epitaxially grown on the semiconductor layer 104 using a planar epitaxy process. In one embodiment, the sacrificial layer 106 may be in-situ doped with metal ions (for example, aluminum) during the planar epitaxial growth. The sacrificial layer 106 can be epitaxially grown to a height ranging from 5 nm to 50 nm or more, for example, 10 nm, although other heights are within the contemplated scope of the disclosure.

In one embodiment, a semiconductor layer 108 may be formed on the sacrificial layer 106. In this manner, a buried sacrificial layer 106 may be formed between the two opposing semiconductor layers 104 and 108. The semiconductor layer 108 can be made of a similar material as the semiconductor layer 104. The semiconductor layer 108, in a similar manner as the semiconductor layer 104, may serve as an etch stop during a subsequent undercut etch process, described in further detail herein. In one embodiment the semiconductor layer 108 includes gallium nitride (GaN). In one embodiment, the semiconductor layer 108 may be epitaxially grown on the sacrificial layer 106 using a planar epitaxy process. The semiconductor layer 108 can be epitaxially grown to a height ranging from 5 nm to 50 nm or more, for example, 10 nm, although other heights are within the contemplated scope of the disclosure.

In one embodiment, a capping layer 110 may be formed on the semiconductor layer 108. The capping layer 110 can be made of any suitable material, such as, for example, a metal nitride, so long as the capping layer 110 can serve as an etch stop during a subsequent undercut etch process, described in further detail herein. In this manner, the semiconductor layers 104 and 108, and the capping layer 110, all serve as an etch stop during the subsequent undercut etch process. In one embodiment, the capping layer 110 includes aluminum indium nitride (AlInN). In one embodiment, the capping layer 110 may be epitaxially grown on the semiconductor layer 108 using a planar epitaxy process. In one embodiment, the capping layer 110 may be in-situ doped with aluminum during the planar epitaxial growth. In another embodiment, the capping layer 110 can be formed using PVD, CVD, MOCVD, ultrahigh vacuum chemical vapor deposition (UHVCVD), rapid thermal chemical vapor deposition (RTCVD), low-pressure chemical vapor deposition (LPCVD), limited reaction processing CVD (LRP-CVD), MBE, and/or ALD, and the like. The capping layer 110 can be formed to a height ranging from 5 nm to 50 nm or more, for example, 10 nm, although other heights are within the contemplated scope of the disclosure.

Figure 2:
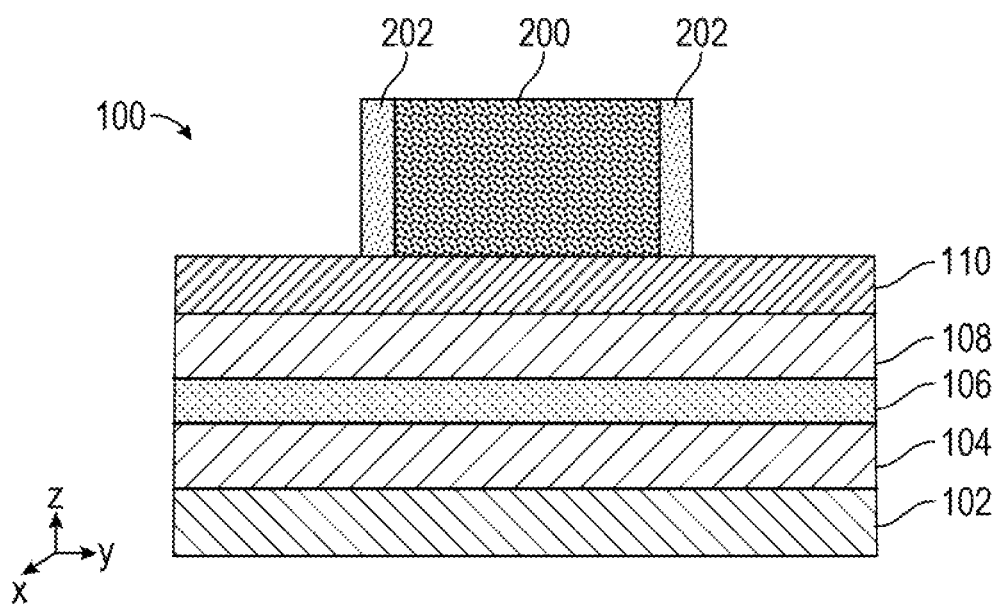
FIG. 2 shows a partial structure of a semiconductor device during the fabrication of a nanoribbon transistor, in accordance with one or more example embodiments of the disclosure.

FIG. 2 depicts a cross-sectional view of the semiconductor structure 100 after forming a sacrificial gate 200 during the fabrication of a III-N nanoribbon transistor in accordance with one or more example embodiments of the disclosure. As depicted in FIG. 2, the sacrificial gate 200 may be formed on a surface of the capping layer 110. The sacrificial gate 200 (also known as a dummy gate) can be made of any suitable material, such as, for example, amorphous silicon or polysilicon. The sacrificial gate 200 can be formed using any known method for patterning a sacrificial gate, such as, for example, a polysilicon fill followed by a wet etch, a dry etch, or a combination of sequential wet and/or dry etches. The sacrificial gate 200 can be deposited using PVD, CVD, MOCVD, MBE and/or ALD, and the like. The sacrificial gate 200 can be formed to a height ranging from 10 nm to 100 nm or more, for example, 40 nm, although other heights are within the contemplated scope of the disclosure.

In one embodiment, the semiconductor structure 100 can include spacers 202. The spacers 202 serve to provide electrical insulation between the gate and source and drain regions (to be described in further detail below). The spacers 202 can be formed using any suitable process. In one embodiment, a conformal layer may be deposited over the semiconductor structure 100 and patterned to form the spacers 202. The conformal layer can be deposited using PVD, CVD, MOCVD, MBE and/or ALD, and the like. The conformal layer can be deposited to a height ranging from 3 nm to 50 nm or more, for example, 10 nm, although other heights are within the contemplated scope of the disclosure. The conformal layer can be patterned using a wet etch, a dry etch, or a combination of sequential wet and/or dry etches. In one embodiment, the conformal layer may be patterned using a directional etch, such as a reactive ion etch (RIE). In one embodiment, the RIE may be selective to the capping layer 110 and/or the sacrificial gate 200.

Figure 3:
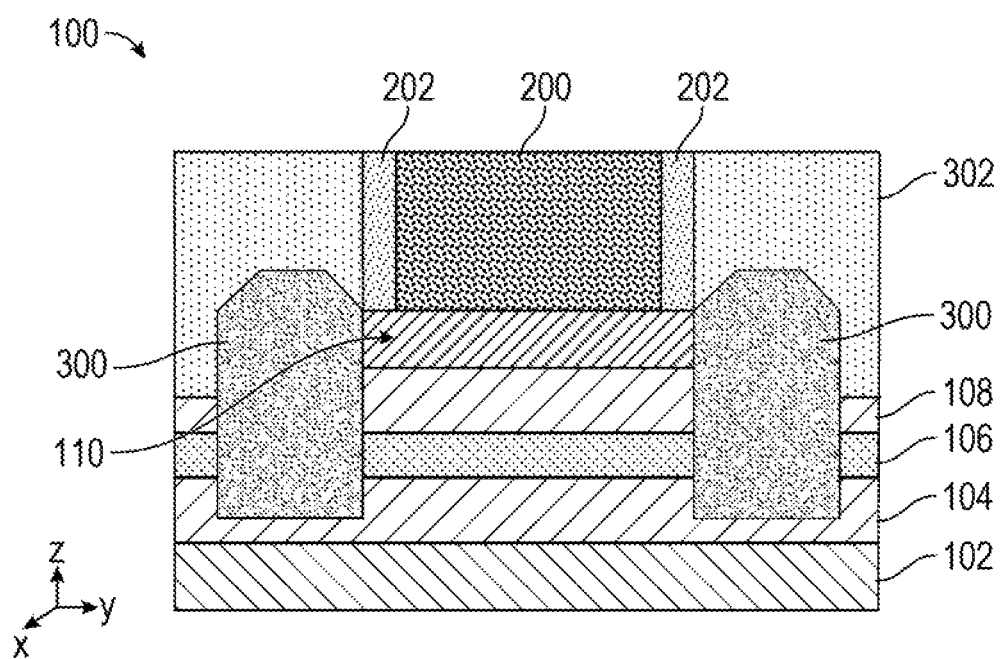
FIG. 3 shows a partial structure of a semiconductor device during the fabrication of a nanoribbon transistor, in accordance with one or more example embodiments of the disclosure.

FIG. 3 depicts a cross-sectional view of the semiconductor structure 100 after forming recessed source and drain regions 300 during the fabrication of a III-N nanoribbon transistor in accordance with one or more example embodiments of the disclosure. As depicted in FIG. 3, the source and drain regions 300 are formed on a recessed surface of the semiconductor layer 104. In one embodiment, portions of the sacrificial layer 106, the semiconductor layer 108, and the capping layer 110 are removed and the semiconductor layer 104 may be recessed to form a trench exposing a recessed surface of the semiconductor layer 104. The trench can be patterned using a wet etch, a dry etch, or a combination of sequential wet and/or dry etches. In one embodiment, the trench may be formed using one or more etches selective to the sacrificial gate 200 and/or the spacers 202.

In one embodiment, the source and drain regions 300 are epitaxially grown in the trench on the exposed surface of the semiconductor layer 104. In one embodiment, the source and drain regions 300 are selectively grown in the trench. The source and drain regions 300 can be epitaxially formed by a variety of methods, such as, for example, in-situ doped epitaxy, doped following the epitaxy, or by implantation and plasma doping. The source and drain regions 300 can be epitaxial semiconductor materials grown from gaseous or liquid precursors. The source and drain regions 300 can be doped with n-type dopants (for example, phosphorus, arsenic, or antimony) or p-type dopants (for example, boron, gallium, $BF_2$, or aluminum). The dopant concentration in the source and drain regions 300 can range from $1\times10^{19}$ cm$^{-3}$ to $2\times10^{21}$ cm$^{-3}$, for example, $1\times10^{20}$ cm$^{-3}$. In one embodiment, the source and drain regions 300 are both doped with n-type dopants. In one embodiment, the source and drain regions 300 are both doped with p-type dopants. In one embodiment, the doping can include generating electron vacancies in the source and drain regions 300. In one embodiment, the source and drain regions 300 can be doped, for example, by creating vacancies of sulfur and selenium. In one embodiment, the source and drain regions 300 can be doped with oxygen vacancies if the source comprises an oxide or a multi-material system. In another embodiment, the source and drain regions 300 can be doped with phosphorous, boron, aluminum, tin, hafnium, titanium, copper, indium, and/or arsenic if the source and drain regions 300 comprise a non-oxide a single-material semiconductor.

In one embodiment, the source and drain regions 300 can include silicon, or any other suitable semiconductor material for source and drain regions. In another embodiment, the source and drain regions 300 can include doped or undoped black phosphorous, titanium, tantalum, cobalt, molybdenum, titanium nitride, tantalum nitride, hafnium, copper, gadolinium, and the like. In one embodiment, the source and drain regions 300 can include silicon, germanium, silicon germanium (SiGe), indium phosphide (InP), indium arsenide (InAs), indium gallium arsenide (InGaAs), gallium nitride (GaN), gallium arsenide antimonide (GaAsSb), amorphous semiconductors such as zinc oxide (ZnO), indium gallium zinc oxide (IGZO), amorphous silicon (a-Si), amorphous germanium (a-Ge), polycrystalline germanium, polycrystalline silicon, and/or polycrystalline InGaAs, and the like. In one embodiment, the source and drain regions 300 can include gettering materials. In one embodiment, the gettering materials can getter sulfur. In one embodiment, the source and drain regions 300 can be approximately 1 nanometer to approximately 100 nm thick, for example, 10 nm to approximately 50 nm thick, although other thicknesses are within the contemplated scope of the disclosure.

In one embodiment, the semiconductor structure 100 includes an ILD 302. The ILD 302 can be made of, for example, silicon dioxide. In one embodiment, portions of the capping layer 110 are removed to expose a surface of the semiconductor layer 108. In one embodiment, the ILD 302 may be formed on the exposed surface of the semiconductor layer 108. In one embodiment, the semiconductor layer 108 may be recessed prior to forming the ILD 302. The ILD 302 can be deposited using PVD, CVD, MOCVD, MBE and/or ALD, and the like.

Figure 4:
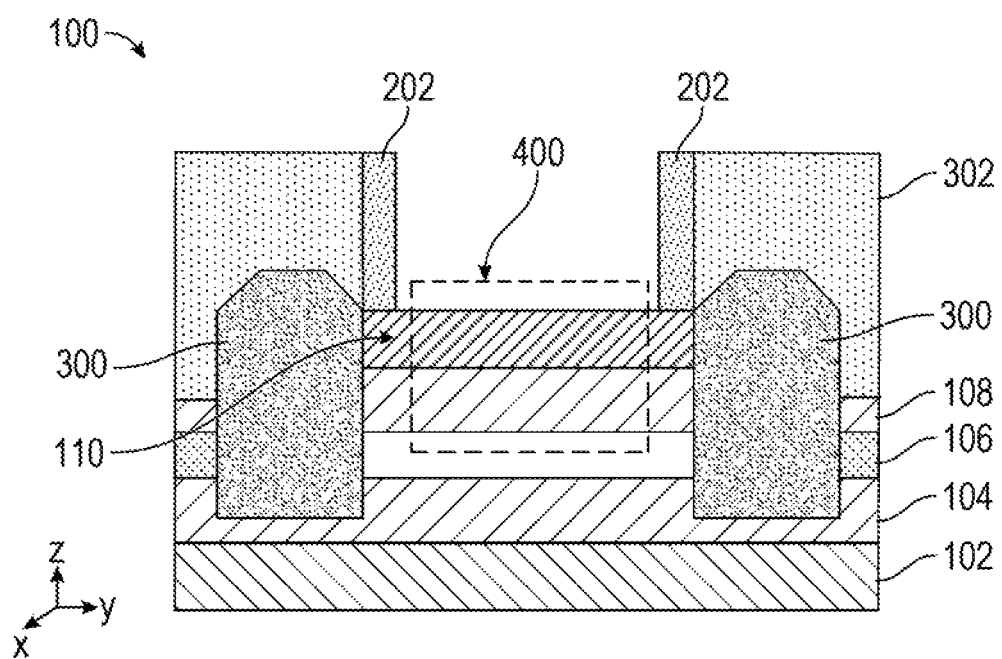
FIG. 4 shows a partial structure of a semiconductor device during the fabrication of a nanoribbon transistor, in accordance with one or more example embodiments of the disclosure.

FIG. 4 depicts a cross-sectional view of the semiconductor structure 100 after removing the sacrificial gate 200 and exposed portions of the sacrificial layer 106 during the fabrication of a III-N nanoribbon transistor in accordance with one or more example embodiments of the disclosure. The sacrificial gate 200 can be selectively removed using any suitable process known for RMG workflows. In one embodiment, for example, the sacrificial gate 200 includes polysilicon and the sacrificial gate 200 may be selectively removed using tetramethylammonia (TAMH), hot ammonia, or the like. This process exposes sidewalls of the sacrificial layer 106.

Once the sacrificial gate 200 may be removed, an undercut etch process can be employed whereby sidewalls of the sacrificial layer 106 are exposed to a wet etchant and the sacrificial layer 106 may be removed from under the semiconductor layer 108. In this manner, the III-N nanoribbon 400 may be released. In one embodiment, the undercut etch process exposes sidewalls of the source and drain regions 300. Any wet etchant suitable for removing the sacrificial layer 106 can be used. In one embodiment, the sacrificial layer 106 may be an aluminum-rich nitride and the sacrificial layer 106 may be removed using a hydrochloric acid or hydrofluoric acid-based wet etchant. As discussed previously herein, the materials of the semiconductor layers 104 and 108 and the capping layer 110 are selected such that all serve as an etch stop during this undercut etch process. For example, the semiconductor layers 104 and 108 can be made of GaN and the capping layer 110 can be made of AlInN, as these materials are not easily removed using a hydrochloric acid or hydrofluoric acid-based wet etchant.

Figure 5:
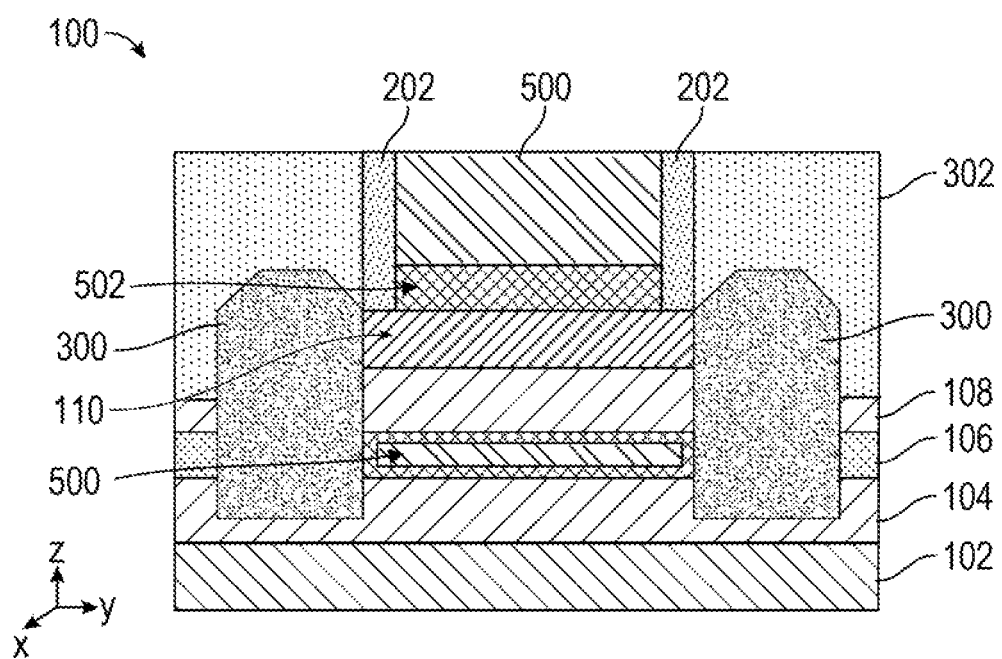
FIG. 5 shows a partial structure of a semiconductor device during the fabrication of a nanoribbon transistor, in accordance with one or more example embodiments of the disclosure.

FIG. 5 depicts a cross-sectional view of the semiconductor structure 100 after a RMG module during the fabrication of a III-N nanoribbon transistor in accordance with one or more example embodiments of the disclosure. As depicted in FIG. 5, a gate 500 may be formed over a channel region of the semiconductor structure 100. In one embodiment, the gate 500 is a high-k metal gate (HKMG) and can include a gate dielectric 502. In one embodiment, the gate dielectric 502 may be a high-k dielectric film. The gate 500 and the gate dielectric 502 are collectively referred to as a gate stack. In one embodiment, the gate stack also includes a work function metal (not depicted). In one embodiment, the gate 500 and the gate dielectric 502 each wrap completely around a surface of the semiconductor layer 108. This wrap-around gate structure, also known as gate all around (GAA), can provide greater electrostatic control over the channel region and can reduce leakage current and other short-channel effects, such as drain-induced barrier lowering (DIBL). Such effects can make it less likely for the voltage on a gate electrode to sufficiently deplete the channel underneath the gate electrode, thereby reducing or stopping the flow of carriers through the channel, which can cause the transistor to perform poorly or fail (for example, remain turned off).

In one embodiment, the gate dielectric 502 wraps around a surface of the semiconductor layer 108 and a surface of the capping layer 110 in the channel region of the semiconductor structure 100. Non-limiting examples of suitable materials for the gate dielectric 502 include oxides, such as silicon dioxide, nitrides, such as silicon nitride, oxynitrides, silicates (for example, metal silicates), aluminates, titanates, or any combination thereof. In one embodiment, an electroglass (EG) can be used as the gate dielectric 502. In one embodiment, the gate dielectric 502 can include hexagonal boron nitride (HBN). In one embodiment, the gate dielectric 502 can include a dielectric material having a dielectric constant greater than, for example, 3.9, 7.0, or 10.0. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric 502 can further include dopants such as, for example, lanthanum and aluminum. The gate dielectric 502 can be formed by any suitable deposition process, for example, using PVD, CVD, MOCVD, MBE, and/or ALD, and the like. In one embodiment, the gate dielectric 502 may be conformally formed over the exposed surface of the semiconductor layer 108. The thickness of the gate dielectric 502 can vary depending on the deposition process as well as the composition and number of high-k dielectric materials used. In one embodiment, the gate dielectric 502 has a thickness in a range from about 0.5 to about 20 nm, with an example thickness of approximately 2 nm to approximately 4 nm.

In one embodiment, the gate 500 wraps around a surface of the gate dielectric 502. In one embodiment, the gate 500 can include a metal. In another embodiment, the gate 500 can include a transition metal or a conductive material. Non-limiting examples of suitable conductive materials for the gate 500 include aluminum (Al), tantalum (Ta), cobalt (Co), nickel (Ni), palladium (Pd), platinum (Pt), gold (Au), silver (Ag), tungsten (W), titanium (Ti), molybdenum (Mo), germanium (Ge), ruthenium (Ru), a conducting metallic compound material (for example, tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, a silicide thereof, or any combination of the foregoing. The conductive material can further include dopants that are incorporated during or after deposition. The gate 500 can be deposited by any suitable deposition process, for example, CVD, PECVD, PVD, plating, thermal or e-beam evaporation, and sputtering. In one embodiment, the gate 500 may be formed by a lithographic patterning and RIE of a bulk gate material (not illustrated). In some embodiments, the bulk gate material can be deposited during a metal filling operation. In some embodiments, the bulk gate material may be overfilled above a surface of the spacers 202 and the gate 500 may be then planarized to a top surface of the spacers 202 using, for example, chemical-mechanical planarization (CMP). In one embodiment, the gate 500 can be used to tune a threshold voltage of the semiconductor structure 100. In one embodiment, the gate 500 can have a thickness (for example, a gate length, as measured between the source and drain regions 300) of 5 nm, 7 nm, or 9 nm or more, although other gate lengths are within the contemplated scope of the disclosure.

In one embodiment, a work function metal (not depicted) may be disposed between the gate dielectric 502 and the gate 500. Non-limiting examples of suitable materials for the work function metal include p-type work function metals (for example, ruthenium, palladium, platinum, cobalt, nickel, and conductive metal oxides, or any combination thereof) and n-type work function metals (for example, hafnium, zirconium, titanium, tantalum, aluminum, metal carbides, hafnium carbide, zirconium carbide, titanium carbide, and aluminum carbide, aluminides, or any combination thereof). In one embodiment, the doping type (n-type or p-type) of the work function metal can be selected based on the doping type of the source and drain regions 300. In one embodiment, the source and drain regions 300 are n-type, and the work function metal is n-type. In one embodiment, the source and drain regions 300 are p-type, and the work function metal is p-type. In one embodiment, the source and drain regions 300 have an opposite doping type as compared to the work function metal.

Figure 6:
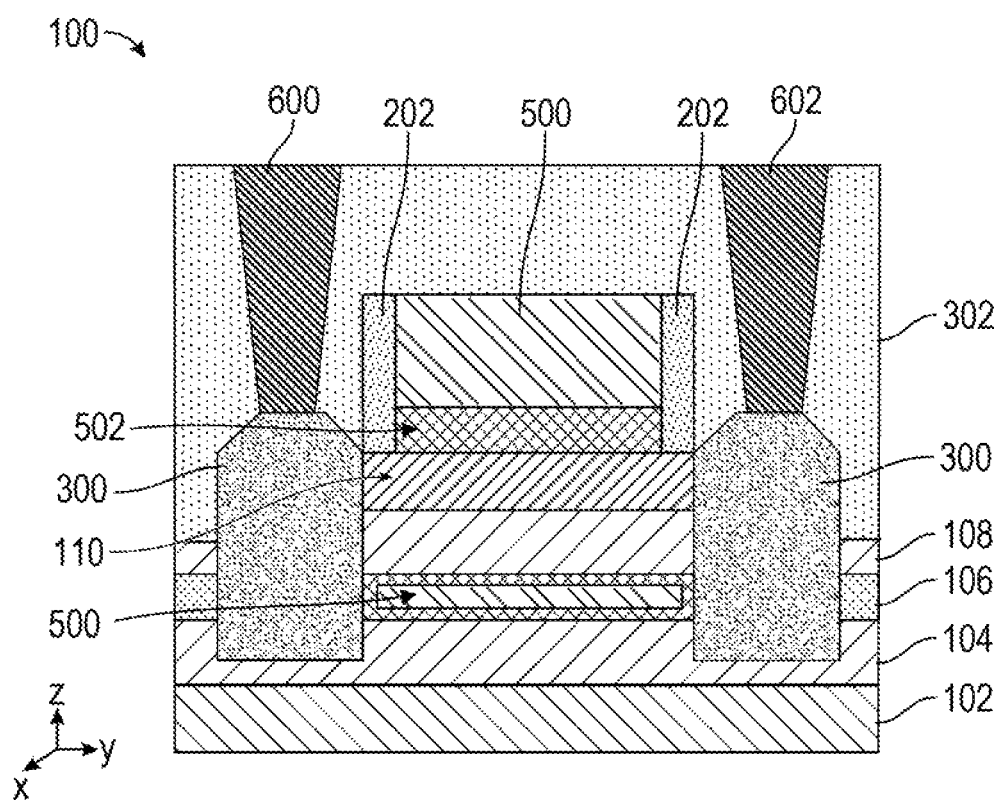
FIG. 6 shows a partial structure of a semiconductor device during the fabrication of a nanoribbon transistor, in accordance with one or more example embodiments of the disclosure.

FIG. 6 depicts a cross-sectional view of the semiconductor structure 100 during the fabrication of a III-N nanoribbon transistor in accordance with one or more example embodiments of the disclosure. In one embodiment, the semiconductor structure 100 includes a source contact 600 and a drain contact 602. The source contact 600 and the drain contact 602 can be formed using known metallization techniques. In one embodiment, the ILD 302 may be extended above a surface of the spacers 202 and the gate 500. The ILD 302 can be patterned using, for example, a wet etch, a dry etch, or a combination thereof, to provide trenches over the source and drain regions 300. In one embodiment, these trenches are filled with conductive material to form the source contact 600 and the drain contact 602. In one embodiment, the conductive material may be overfilled into the trenches, forming overburdens above a surface of the ILD 302. The overburden can be removed using, for example, CMP.

The source contact 600 and the drain contact 602 can be made of any suitable conducting material, such as, for example, metal (for example, tungsten, titanium, tantalum, ruthenium, zirconium, cobalt, copper, aluminum, lead, platinum, tin, silver, gold), conducting metallic compound material (for example, tantalum nitride, titanium nitride, tantalum carbide, titanium carbide, titanium aluminum carbide, tungsten silicide, tungsten nitride, ruthenium oxide, cobalt silicide, nickel silicide), carbon nanotubes, conductive carbon, graphene, or any suitable combination of these materials. The conductive material can further include dopants that are incorporated during or after deposition. In one embodiment, the contacts can be copper or tungsten and can include a barrier metal liner (not depicted). A barrier metal liner prevents copper or tungsten from diffusing into, or doping, the surrounding materials, which can degrade their properties. Silicon, for example, forms deep-level traps when doped with copper. An ideal barrier metal liner must limit the bulk metal diffusivity sufficiently to chemically isolate the conductor from the surrounding materials and should have a high electrical conductivity, for example, tantalum, tantalum nitride, titanium, titanium nitride, cobalt, ruthenium, manganese, or titanium carbide.

In one embodiment, the source contact 600 and the drain contact 602 include a metal (for example, titanium) that reacts with semiconductor materials (for example, the source and drain regions 300) to form a silicide film (not depicted) between the source and drain regions 300 and the source contact 600 and the drain contact 602. As the silicide film is only formed at the interface between the contacts 600 and 602 and the source and drain regions 300, the silicide film can be said to be self-aligned to the top surfaces of the source and drain regions 300 (a self-aligned silicide is also referred to as a salicide).

Figure 7:
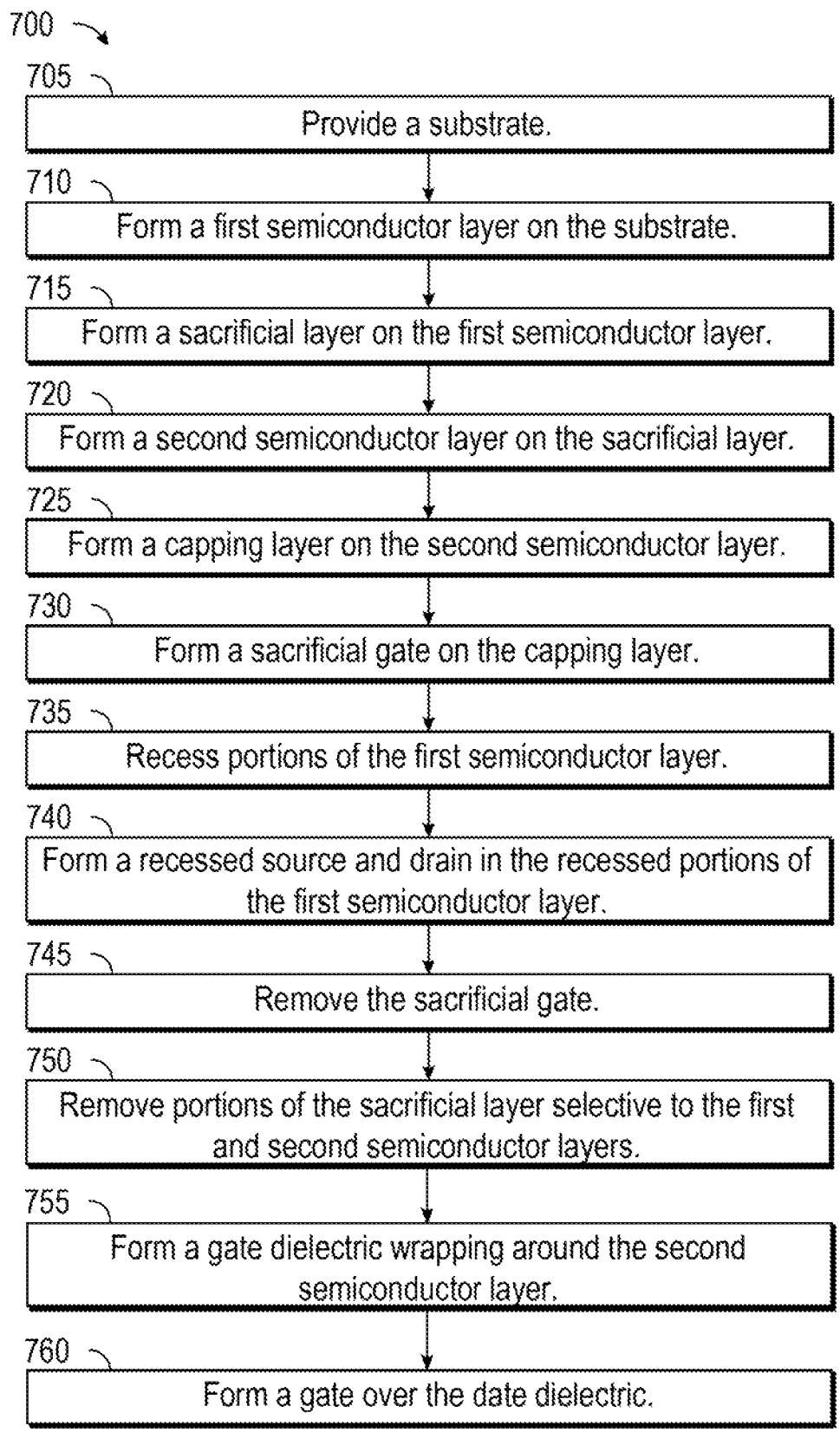
FIG. 7 shows a diagram of an example process flow for the fabrication of a nanoribbon transistor, in accordance with example embodiments of the disclosure.

FIG. 7 shows a diagram of an example flow diagram for the fabrication of a nanoribbon transistor, in accordance with example embodiments of the disclosure. In block 705, a substrate can be provided. In one embodiment, the substrate can refer to a solid (usually planar) substance onto which a layer of another substance is applied, and to which that second substance adheres. In another embodiment, the substrate can include a semiconductor material having a Miller indices of {111}.

In block 710, a first semiconductor layer may be formed on the substrate. The first semiconductor layer can be formed in a similar manner as the semiconductor layer 104 discussed previously herein. In one embodiment the first semiconductor layer includes gallium nitride (GaN). In one embodiment, the first semiconductor layer may be epitaxially grown on the substrate using a planar epitaxy process. In one embodiment, planar epitaxy results in the first semiconductor layer having a hexagonal crystalline structure (for example, a structure having Miller indices of {111}).

In block 715, a sacrificial layer may be formed on the first semiconductor layer. The sacrificial layer can be formed in a similar manner as the sacrificial layer 106 discussed previously herein. The sacrificial layer material may be selected such that the sacrificial layer can be etched selective to the first semiconductor layer during a subsequent undercut etch process (see block 750). In one embodiment, the sacrificial layer may be an aluminum rich layer, such as, for example, aluminum nitride (AlN).

In block 720, a second semiconductor layer may be formed on the sacrificial layer. The second semiconductor layer can be formed in a similar manner as the second semiconductor layer 108 discussed previously herein. In one embodiment the second semiconductor layer includes gallium nitride (GaN). In one embodiment, the second semiconductor layer may be epitaxially grown using a planar epitaxy process. In one embodiment, planar epitaxy results in the second semiconductor layer having a hexagonal crystalline structure (for example, a structure having Miller indices of {111}).

In block 725, a capping layer may be formed on the second semiconductor layer. The capping layer can be formed in a similar manner as the capping layer 110 discussed previously herein. The capping layer can be made of any suitable material, such as, for example, a metal nitride. In one embodiment, the capping layer includes aluminum indium nitride (AlInN).

In block 730, a sacrificial gate may be formed on the capping layer. The sacrificial gate can be formed in a similar manner as the sacrificial gate 200 discussed previously herein. The sacrificial gate can be made of any suitable material, such as, for example, amorphous silicon or polysilicon.

In block 735, portions of the first semiconductor layer are recessed to provide a first recessed surface and a second recessed surface. In one embodiment, the first semiconductor layer may be recessed using a RIE selective to spacers formed adjacent to the sacrificial gate.

In block 740, source and drain regions are formed on the first and second recessed surfaces of the first semiconductor layer. The recessed source and drain regions can be formed in a similar manner as the recessed source and drain regions 300 discussed previously herein. The recessed source and drain regions can be doped with n-type or p-type dopants.

In block 745, the sacrificial gate may be removed. The sacrificial gate can be removed using known RMG workflows. Removing the sacrificial gate exposes sidewalls of the sacrificial layer.

In block 750, exposed portions of the sacrificial layer (those portions under the second semiconductor layer which were exposed when the sacrificial gate was removed) are removed, in an undercut etch process. In one embodiment, the exposed portions of the sacrificial layer are etched using a wet etchant selective to the first and second semiconductor layers. In one embodiment, the wet etchant includes one or more of hydrofluoric acid and hydrochloric acid.

In block 755, a gate dielectric may be formed around the second semiconductor layer. In one embodiment, the gate dielectric may be conformally deposited onto the second semiconductor layer such that the gate dielectric completely wraps around (surrounds) a channel (also known as a channel region) of the second semiconductor layer. In one embodiment, the gate dielectric partially fills the space between the first and second semiconductor layers (the cavity formed by removing the sacrificial layer). In one embodiment the gate dielectric includes a high-k dielectric material.

In block 760, a gate may be formed over the gate dielectric such that the gate surrounds the channel of the second semiconductor layer. The gate can be formed in a similar manner as the gate 500 discussed previously herein. In one embodiment, the gate fills the remaining space in the cavity between the first and second semiconductor layers.

Figure 8:
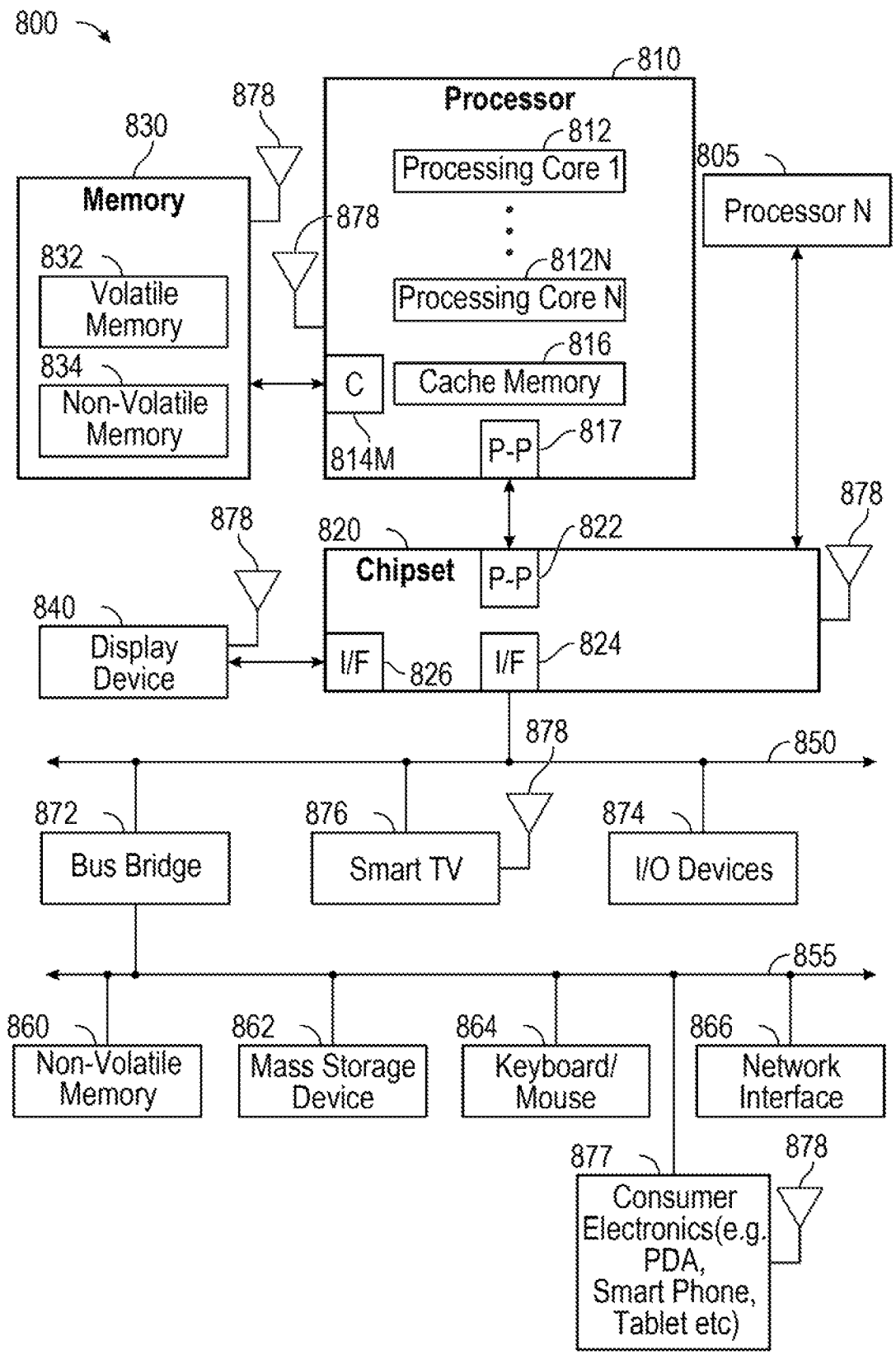
FIG. 8 depicts an example of a system, in accordance with one or more embodiments of the disclosure.

FIG. 8 depicts an example of a system 800 according to one or more embodiments of the disclosure. In one embodiment, the nanoribbon transistors described herein can be used in connection with or formed as a part of any of the devices shown in system 800. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 can include a system on a chip (SOC) system.

In one embodiment, system 800 includes multiple processors including processor 810 and processor N 805, where processor N 805 has logic similar or identical to the logic of processor 810. In one embodiment, processor 810 has one or more processing cores (represented here by processing core 1 812 and processing core N 812N, where 812N represents the Nth processor core inside processor 810, where N is a positive integer). More processing cores can be present (but not depicted in the diagram of FIG. 8). In some embodiments, processor core 812 includes, but is not limited to, pre-fetch logic to fetch instructions, decode logic to decode the instructions, execution logic to execute instructions, a combination thereof, or the like. In some embodiments, processor 810 has a cache memory 816 to cache instructions and/or data for system 800. Cache memory 816 may be organized into a hierarchical structure including one or more levels of cache memory.

In some embodiments, processor 810 includes a memory controller (MC) 814, which is configured to perform functions that enable the processor 810 to access and communicate with memory 830 that includes a volatile memory 832 and/or a non-volatile memory 834. In some embodiments, processor 810 can be coupled with memory 830 and chipset 820. Processor 810 may also be coupled to a wireless antenna 877 to communicate with any device configured to transmit and/or receive wireless signals. In one embodiment, the wireless antenna 877 operates in accordance with, but is not limited to, the IEEE 1102.11 standard and its related family, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory device 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interface 817 and P-P interface 822. Chipset 820 enables processor 810 to connect to other elements in system 800. In some embodiments of the disclosure, P-P interface 817 and P-P interface 822 can operate in accordance with a PtP communication protocol, such as the Intel® QuickPath Interconnect (QPI) or the like. In other embodiments, a different interconnect may be used.

In some embodiments, chipset 820 can be configured to communicate with processor 810, the processor N 805, display device 840, and other devices 872, 876, 874, 860, 862, 864, 866, 877, etc. Chipset 820 may also be coupled to the wireless antenna 877 to communicate with any device configured to transmit and/or receive wireless signals.

Chipset 820 connects to display device 840 via interface 826. Display 840 may be, for example, a liquid crystal display (LCD), a plasma display, cathode ray tube (CRT) display, or any other form of visual display device. In some embodiments of the disclosure, processor 810 and chipset 820 are integrated into a single SOC. In addition, chipset 820 connects to bus 850 and/or bus 855 that interconnect various elements 874, 860, 862, 864, and 866. Bus 850 and bus 855 may be interconnected via a bus bridge 872. In one embodiment, chipset 820 couples with a non-volatile memory 860, a mass storage device(s) 862, a keyboard/mouse 864, and a network interface 866 via interface 824 and/or 826, smart TV 876, consumer electronics 877, etc.

In one embodiment, mass storage device(s) 862 can include, but not be limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 702.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 or selected elements thereof can be incorporated into processor core 812.

It is noted that the system 800 described herein may include any suitable type of microelectronics packaging and configurations thereof, including, for example, system in a package (SiP), system on a package (SOP), package on package (PoP), interposer package, 3D stacked package, etc. Further, any suitable type of microelectronic components may be provided in the semiconductor packages, as described herein. For example, microcontrollers, microprocessors, baseband processors, digital signal processors, memory dies, field gate arrays, logic gate dies, passive component dies, MEMSs, surface mount devices, application specific integrated circuits, baseband processors, amplifiers, filters, combinations thereof, or the like may be packaged in the semiconductor packages, as disclosed herein. The semiconductor devices (for example, the semiconductor devices described in connection with any of FIGS. 1-6), as disclosed herein, may be provided in any variety of electronic devices including consumer, industrial, military, communications, infrastructural, and/or other electronic devices.

In various embodiments, the devices, as described herein, may be used in connection with one or more processors. The one or more processors may include, without limitation, a central processing unit (CPU), a digital signal processor(s) (DSP), a reduced instruction set computer (RISC), a complex instruction set computer (CISC), a microprocessor, a microcontroller, a field programmable gate array (FPGA), or any combination thereof. The processors may also include one or more application specific integrated circuits (ASICs) or application specific standard products (ASSPs) for handling specific data processing functions or tasks. In certain embodiments, the processors may be based on an Intel® Architecture system and the one or more processors and any chipset included in an electronic device may be from a family of Intel® processors and chipsets, such as the Intel® Atom® processor(s) family or Intel-64 processors (for example, Sandy Bridge®, Ivy Bridge®, Haswell®, Broadwell®, Skylake®, etc.).

Additionally or alternatively, the devices, as described herein, may be used in connection with one or more additional memory chips. The memory may include one or more volatile and/or non-volatile memory devices including, but not limited to, magnetic storage devices, read-only memory (ROM), random access memory (RAM), dynamic RAM (DRAM), static RAM (SRAM), synchronous dynamic RAM (SDRAM), double data rate (DDR) SDRAM (DDR-SDRAM), RAM-BUS DRAM (RDRAM), flash memory devices, electrically erasable programmable read-only memory (EEPROM), non-volatile RAM (NVRAM), universal serial bus (USB) removable memory, or combinations thereof.

In example embodiments, the electronic device in which the disclosed devices are used and/or provided may be a computing device. Such a computing device may house one or more boards on which the devices may be disposed. The board may include a number of components including, but not limited to, a processor and/or at least one communication chip. The processor may be physically and electrically connected to the board through, for example, electrical connections of the devices. The computing device may further include a plurality of communication chips. For instance, a first communication chip may be dedicated to shorter range wireless communications such as Wi-Fi and Bluetooth, and a second communication chip may be dedicated to longer range wireless communications such as GPS, EDGE, GPRS, CDMA, WiMAX, LTE, EV-DO, and others. In various example embodiments, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, combinations thereof, or the like. In further example embodiments, the computing device may be any other electronic device that processes data.

Example 1 may include an integrated circuit (IC) structure, the structure comprising: a first layer on a substrate, the first layer having a first recessed surface and a second recessed surface, the first layer comprising a group III semiconductor material and nitrogen; a source on the first recessed surface of the first layer; a drain on the second recessed surface of the first layer; a second layer on the first layer, the second layer comprising a group III semiconductor material and nitrogen, the second layer between the source and drain; and a gate on at least part of the second layer.

Example 2 may include the structure of example 1 and/or some other example herein, further comprising a third layer on the second layer, the third layer between the source and drain.

Example 3 may include the structure of example 2 and/or some other example herein, wherein the third layer comprises a metal and nitrogen.

Example 4 may include the structure of example 3 and/or some other example herein, wherein the third layer comprises aluminum, indium, and nitrogen.

Example 5 may include the structure of example 2 and/or some other example herein, wherein the gate surrounds a portion of the third layer.

Example 6 may include the structure of example 1 and/or some other example herein, wherein the substrate comprises Miller indices of {111}.

Example 7 may include the structure of example 6 and/or some other example herein, wherein the first layer comprises Miller indices of {111}.

Example 8 may include the structure of example 1 and/or some other example herein, wherein the second layer comprises gallium and nitrogen.

Example 9 may include a device including a nanoribbon field effect transistor (FET), the device comprising: a first layer on a substrate, the first layer having a first recessed surface and a second recessed surface, the first layer comprising a group III semiconductor material and nitrogen; a source on the first recessed surface of the first layer; a drain on the second recessed surface of the first layer; a second layer on the first layer, the second layer comprising a group III semiconductor material and nitrogen, the second layer between the source and drain; and a gate on at least part of the second layer.

Example 10 may include the device of example 9 and/or some other example herein, further comprising a third layer on the second layer, the third layer between the source and drain.

Example 11 may include the device of example 10 and/or some other example herein, wherein the third layer comprises a metal and nitrogen.

Example 12 may include the device of example 11 and/or some other example herein, wherein the third layer comprises aluminum, indium, and nitrogen.

Example 13 may include the device of example 9 and/or some other example herein, wherein the substrate comprises Miller indices of {111}.

Example 14 may include the device of example 13 and/or some other example herein, wherein the first layer comprises Miller indices of {111}.

Example 15 may include the device of example 10 and/or some other example herein, wherein the gate surrounds a portion of the third layer.

Example 16 may include the device of example 9 and/or some other example herein, wherein the second layer comprises gallium and nitrogen.

Example 17 may include a method for fabricating an integrated circuit (IC) structure, the method comprising: forming a first layer on a substrate, the first layer comprising a group III semiconductor material and nitrogen; recessing a first surface and a second surface of the first layer; forming a source on the first recessed surface of the first layer; forming a drain on the second recessed surface of the first layer; forming a second layer on the first layer, the second layer comprising a group III semiconductor material and nitrogen, the second layer between the source and drain; and forming a gate on at least part of the second layer.

Example 18 may include the method of example 17 and/or some other example herein, further comprising forming a third layer between the first and second layers, the third layer comprising a sacrificial material.

Example 19 may include the method of example 18 and/or some other example herein, wherein the sacrificial material comprises a metal and nitrogen.

Example 20 may include the method of example 17 and/or some other example herein, further comprising removing the third layer selective to the first and second layers.

Example 21 may include a device comprising an integrated circuit (IC) structure comprising: a first layer on a substrate, the first layer having a first recessed surface and a second recessed surface, the first layer comprising a group III semiconductor material and nitrogen; a source on the first recessed surface of the first layer; a drain on the second recessed surface of the first layer; a second layer on the first layer, the second layer comprising a group III semiconductor material and nitrogen, the second layer between the source and drain; and a gate on at least part of the second layer.

Example 22 may include the device of example 21 and/or some other example herein, further comprising a third layer on the second layer, the third layer between the source and drain.

Example 23 may include the device of example 22 and/or some other example herein, wherein the third layer comprises a metal and nitrogen.

Example 24 may include the device of example 23 and/or some other example herein, wherein the third layer comprises aluminum, indium, and nitrogen.

Example 25 may include the device of example 22 and/or some other example herein, wherein the gate surrounds a portion of the third layer.

Example 26 may include the device of example 21 and/or some other example herein, wherein the substrate comprises Miller indices of {111}.

Example 27 may include the device of example 26 and/or some other example herein, wherein the first layer comprises Miller indices of {111}.

Example 28 may include the device of example 21 and/or some other example herein, wherein the second layer comprises gallium and nitrogen.

Example 29 may include a method for fabricating a device comprising an integrated circuit (IC) structure, the method comprising: forming a first layer on a substrate, the first layer comprising a group III semiconductor material and nitrogen; recessing a first surface and a second surface of the first layer; forming a source on the first recessed surface of the first layer; forming a drain on the second recessed surface of the first layer; forming a second layer on the first layer, the second layer comprising a group III semiconductor material and nitrogen, the second layer between the source and drain; and forming a gate on at least part of the second layer.

Example 30 may include the method of example 29 and/or some other example herein, further comprising forming a third layer between the first and second layers, the third layer comprising a sacrificial material.

Example 31 may include the method of example 30 and/or some other example herein, wherein the sacrificial material comprises a metal and nitrogen.

Example 32 may include the method of example 29 and/or some other example herein, further comprising removing the third layer selective to the first and second layers.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

While the disclosure includes various embodiments, including at least a best mode, it is to be understood that many alternatives, modifications, and variations will be apparent to those skilled in the art in light of the foregoing description. Accordingly, the disclosure is intended to embrace all such alternatives, modifications, and variations, which fall within the scope of the included claims. All matters disclosed herein or shown in the accompanying drawings are to be interpreted in an illustrative and non-limiting sense.

This written description uses examples to disclose certain embodiments of the disclosure, including the best mode, and also to enable any person skilled in the art to practice certain embodiments of the disclosure, including making and using any apparatus, devices or systems and performing any incorporated methods and processes. The patentable scope of certain embodiments of the disclosure is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) structure, comprising:
   a first crystalline layer over a substrate, the first crystalline layer comprising a group III element and nitrogen;
   a second crystalline layer over the first crystalline layer, the second crystalline layer comprising a group III element and nitrogen;
   a third crystalline layer over the second crystalline layer, the third crystalline layer comprising a group III element and nitrogen;
   a source and a drain laterally spaced apart by a length of the third crystalline layer; and
   a gate stack over at least a portion of the length of the third crystalline layer, and between the first and second crystalline layers.

2. The structure of claim 1, wherein the source and the drain extend through the second crystalline layer, and are laterally adjacent to a portion of the gate stack that is between the first and second crystalline layers.

3. The structure of claim 2, wherein the source and drain are in contact with the first crystalline layer.

4. The structure of claim 1, wherein the second layer comprises Ga and wherein the third layer comprises more Al than the second layer.

5. The structure of claim 4, wherein the third layer further comprises indium, and nitrogen.

6. The structure of claim 1, wherein the first crystalline layer is over a (111) surface of the substrate.

7. The structure of claim 6, wherein the second and third crystalline layers are epitaxial to the first crystalline layer, and the first crystalline layer has hexagonal crystallinity.

8. The structure of claim 1, wherein the first and the second crystalline layers comprise binary GaN.

9. A device including a nanoribbon field effect transistor (FET), the device comprising:
   a first layer on a substrate, the first layer having a first recessed surface and a second recessed surface, the first layer comprising a group III semiconductor material including nitrogen;
   a source on the first recessed surface of the first layer;
   a drain on the second recessed surface of the first layer;
   a second layer on the first layer, the second layer comprising a group III semiconductor material including nitrogen, the second layer between the source and drain; and
   a gate on at least part of the second layer.

10. The device of claim 9, further comprising a third layer on the second layer, the third layer between the source and drain.

11. The device of claim 10, wherein the third layer comprises a metal and nitrogen.

12. The device of claim 11, wherein the third layer comprises aluminum, indium, and nitrogen.

13. The device of claim 10, wherein the gate surrounds a portion of the third layer.

14. The device of claim 9, wherein the substrate comprises Miller indices of {111}.

15. The device of claim 14, wherein the first layer comprises Miller indices of {111}.

16. The device of claim 9, wherein the second layer comprises gallium and nitrogen.

17. A method for fabricating an integrated circuit (IC) structure, the method comprising:
   forming a first layer over a substrate, the first layer comprising a group III semiconductor material including nitrogen;
   forming a second layer over the first layer, the second layer comprising a group III semiconductor material including nitrogen;
   forming a third layer over the second layer, the third layer comprising a group III semiconductor material including nitrogen;
   forming a source and drain laterally spaced apart by a length of the second and third layers;

removing the second layer from between the first and third layers within at least a portion of the length of the second and third layers; and forming a gate stack by backfilling a region where the second layer was removed from between the first and third layers.

18. The method of claim 17, further comprising forming a fourth layer over the third layer, the fourth layer comprising a group III semiconductor material including nitrogen and Al.

19. The method of claim 17, wherein the first and third layers comprise Ga and the second layer comprises more Al than the first and third layers.

20. The method of claim 17, wherein forming the source and drain further comprise etching recesses through the second and third layers to expose the first layer, and backfilling the recesses, and wherein removing the second layer from between the first and third layers exposes a sidewall portion of the source and drain.

* * * * *